US012764894B2

(12) United States Patent
Burke et al.

(10) Patent No.: US 12,764,894 B2
(45) Date of Patent: Oct. 13, 2026

(54) VENTED PEDESTAL HOUSING

(71) Applicant: CHANNELL COMMERCIAL CORPORATION, Temecula, CA (US)

(72) Inventors: Edward J. Burke, Temecula, CA (US); Thomas Edward Burke, Temecula, CA (US)

(73) Assignee: Channell Commercial Corporation, Rockwall, TX (US)

( * ) Notice: Subject to any disclaimer, the term of this patent is extended or adjusted under 35 U.S.C. 154(b) by 217 days.

(21) Appl. No.: 18/500,837

(22) Filed: Nov. 2, 2023

(65) Prior Publication Data

US 2025/0151225 A1 May 8, 2025

(51) Int. Cl.
*H05K 7/20* (2006.01)

(52) U.S. Cl.
CPC ................................ *H05K 7/20127* (2013.01)

(58) Field of Classification Search
None
See application file for complete search history.

(56) References Cited

U.S. PATENT DOCUMENTS 3,592,260 A * 7/1971 Berger .................. H01L 23/467 165/185
4,609,126 A * 9/1986 Janda .................. H05K 5/0214 220/374
5,243,493 A * 9/1993 Jeng .................. H05K 7/20127 361/752
5,720,407 A * 2/1998 Hoffman ............... F24F 1/0007 220/592.24
6,002,584 A * 12/1999 Messmer ............. H05K 5/0209 174/547
6,019,165 A * 2/2000 Batchelder .............. F28D 15/00 165/80.4
6,095,568 A * 8/2000 Fendt .................. H05K 5/0215 283/79
6,175,494 B1 * 1/2001 Komatsu ............ H05K 7/20127 361/692

(Continued)

OTHER PUBLICATIONS

Original and Translation of CN103906415 (Year: 2014).*
Australian Examination Report for Patent Application No. 2024259645, dated Jul. 17, 2025, 6 pages.

*Primary Examiner* — Timothy J. Dole
*Assistant Examiner* — Muhammed Azam
(74) *Attorney, Agent, or Firm* — Womble Bond Dickinson (US) LLP

(57) ABSTRACT

A vented communications pedestal housing having an upper surface having a bore through the upper surface, the bore having lobed portions extending radially outwardly around a perimeter of the bore, a raised ring extending radially outwardly around the perimeter of the bore, and air grooves on the raised ring extending radially outwardly from the lobed portions, and an identification placard assembly positioned on and extending through the upper surface of the pedestal housing, the identification placard assembly has an upper disk portion and a post extending from the upper disk portion, the post extending through the bore and having a fastener engaging the post for attaching the identification placard assembly to the upper surface of the housing, the upper surface has a plurality of spaced raised ridges forming air flow gaps on the upper surface around the identification placard assembly.

19 Claims, 5 Drawing Sheets

(56) References Cited

U.S. PATENT DOCUMENTS

| | | | | |
|---|---|---|---|---|
| 6,226,182 | B1 * | 5/2001 | Maehara | H05K 7/20127 361/679.48 |
| 6,316,722 | B1 | 11/2001 | Low et al. | |
| 6,493,224 | B1 * | 12/2002 | Mottahed | H05K 7/20127 219/209 |
| 6,506,110 | B1 * | 1/2003 | Borisch | H05K 5/0215 361/678 |
| 6,587,342 | B1 * | 7/2003 | Hsu | H05K 7/20172 415/213.1 |
| 6,749,498 | B2 * | 6/2004 | Pfister | H05K 7/20127 361/692 |
| 7,038,910 | B1 * | 5/2006 | Hodge | H05K 7/20445 361/752 |
| 7,040,383 | B2 * | 5/2006 | Oyamada | H05K 7/20127 165/80.4 |
| 7,251,133 | B2 * | 7/2007 | Wallace | H05K 7/20418 165/185 |
| 7,365,987 | B2 * | 4/2008 | Jeong | H05K 7/20963 361/719 |
| 7,457,133 | B2 * | 11/2008 | Chiang | H05K 7/20127 361/800 |
| 7,663,881 | B2 * | 2/2010 | Kuo | H05K 7/20127 312/236 |
| 7,796,376 | B2 * | 9/2010 | Cairo | H05K 7/2089 165/53 |
| 8,243,451 | B2 * | 8/2012 | Dede | H05K 7/20254 361/689 |
| 8,348,594 | B2 * | 1/2013 | Chen | F04D 29/626 415/206 |
| 8,374,653 | B2 * | 2/2013 | Yokoyama | H05K 7/186 455/90.3 |
| 8,611,088 | B2 * | 12/2013 | Barna | H05K 7/20918 165/122 |
| 8,659,901 | B2 * | 2/2014 | MacManus | H05K 7/20127 343/700 R |
| 8,867,204 | B1 * | 10/2014 | Gardner | H05K 7/1497 361/679.49 |
| 8,937,806 | B2 * | 1/2015 | Senatori | G06F 1/203 361/694 |
| 9,033,777 | B1 * | 5/2015 | Gibboney, Jr. | H05K 7/20127 165/104.21 |
| D735,323 | S * | 7/2015 | Burke | D24/119 |
| D737,432 | S * | 8/2015 | Burke | D24/119 |
| 9,155,222 | B2 * | 10/2015 | Wang | G06F 1/203 |
| D742,506 | S * | 11/2015 | Burke | D24/119 |
| 9,287,613 | B2 * | 3/2016 | Colapietro | H01Q 1/246 |
| 9,436,238 | B1 * | 9/2016 | Douthit | H05K 5/0234 |
| 9,497,885 | B2 * | 11/2016 | Rico | H05K 7/20127 |
| 9,545,030 | B2 * | 1/2017 | Nikkhoo | G06F 3/011 |
| 9,696,769 | B1 * | 7/2017 | Hamilton | H05K 5/03 |
| 9,699,937 | B2 * | 7/2017 | Merlet | H05K 7/20127 |
| 9,769,951 | B2 * | 9/2017 | Ding | G01S 7/02 |
| 9,827,407 | B2 * | 11/2017 | Carrara | B65D 47/42 |
| 9,848,507 | B2 * | 12/2017 | Ahn | H05K 7/20127 |
| 10,028,333 | B2 * | 7/2018 | Gu | H05K 7/20127 |
| 10,090,735 | B2 * | 10/2018 | Bradfield | H02K 9/14 |
| 10,164,504 | B2 * | 12/2018 | Bradfield | H02K 9/06 |
| 10,165,708 | B2 * | 12/2018 | Tian | H05K 7/20263 |
| 10,260,723 | B1 * | 4/2019 | Bryant | F21V 29/10 |
| 10,425,739 | B2 * | 9/2019 | Xu | H04R 9/06 |
| 10,757,836 | B2 * | 8/2020 | Lemacks | H05K 7/20427 |
| 11,116,108 | B2 * | 9/2021 | Kim | H05K 5/03 |
| 11,224,148 | B2 * | 1/2022 | Imura | H05K 5/0213 |
| 11,586,260 | B2 * | 2/2023 | Walker | H02J 7/0045 |
| 11,729,938 | B2 * | 8/2023 | Cueto | H05K 7/20 454/184 |
| 2005/0007737 | A1 * | 1/2005 | Chen | H05K 5/0213 361/692 |
| 2005/0241218 | A1 * | 11/2005 | Frounfelker | A01G 13/26 47/31.1 |
| 2006/0002084 | A1 * | 1/2006 | Wei | H05K 7/20745 361/695 |
| 2008/0101850 | A1 * | 5/2008 | Wojcik | A45D 40/04 401/175 |
| 2008/0175730 | A1 * | 7/2008 | Wysk | F04D 25/0613 417/356 |
| 2009/0155081 | A1 * | 6/2009 | Yu | F04D 25/0613 416/219 R |
| 2009/0175729 | A1 * | 7/2009 | Sun | F04D 29/329 416/244 R |
| 2009/0201641 | A1 * | 8/2009 | Guo | G06F 1/20 361/694 |
| 2010/0128433 | A1 * | 5/2010 | Harwood | H05K 7/20545 361/679.01 |
| 2010/0177478 | A1 * | 7/2010 | Akalanne | H05K 7/20409 361/690 |
| 2010/0177480 | A1 * | 7/2010 | Koplow | H01L 23/467 165/104.34 |
| 2011/0132016 | A1 * | 6/2011 | Chandler | F28F 13/003 62/259.1 |
| 2011/0259903 | A1 * | 10/2011 | Messner | H05K 5/03 220/694 |
| 2013/0050942 | A1 * | 2/2013 | Konishi | H05K 7/20127 361/692 |
| 2014/0126145 | A1 * | 5/2014 | Shih | G06F 1/1683 361/752 |
| 2014/0362519 | A1 * | 12/2014 | Degner | G06F 1/181 361/679.6 |
| 2016/0095252 | A1 * | 3/2016 | Dernier | H05K 5/00 361/690 |
| 2016/0135316 | A1 * | 5/2016 | Kristiansen | H05K 5/06 165/80.3 |
| 2018/0199453 | A1 * | 7/2018 | Linderman | H05K 5/069 |
| 2020/0344904 | A1 * | 10/2020 | Sasaki | H05K 7/20127 |
| 2020/0365062 | A1 | 11/2020 | Geens et al. | |
| 2023/0194815 | A1 | 6/2023 | Geens et al. | |
| 2023/0205285 | A1 * | 6/2023 | Walker | H02J 7/0045 361/679.48 |
| 2023/0328915 | A1 * | 10/2023 | Zhang | H05K 7/20954 |
| 2024/0260209 | A1 * | 8/2024 | Homza | H05K 5/0213 |
| 2025/0151225 | A1 * | 5/2025 | Burke | H05K 7/20127 |
| 2025/0309628 | A1 * | 10/2025 | Burke | H02G 9/10 |

* cited by examiner

VENTED PEDESTAL HOUSING

FIELD OF THE INVENTION

The invention relates to a vented pedestal housing having an identification placard for above ground applications used in various industries.

BACKGROUND

Pedestal housings used in "outside plant" infrastructure for communications and utility companies often house active electronic components which generate heat. The temperature inside the housing increases above ambient conditions due to the heat generated from the active components as well as direct and indirect solar exposure and radiant heat from other objects around the housing. The increase in the internal temperature of the housing transfers heat to the electronic components with adverse consequences. These components tend to fail at shorter and shorter intervals with increases in temperature or operate at reduced rates. As communications companies increase data rates to customers, more active electronics are placed in the outside infrastructure and the higher data rates typically require active components that generate more heat and are more prone to temperature induced failures. There have been many attempts to mitigate the heat buildup with side venting and fans to help remove heated air from inside the housing with various degrees of success. However, the drive to more powerful electronics has created a need for better solutions to the total heating problem.

Prior solutions utilized an additional plastic part over the top of the pedestal known as an attic to improve the looks and strength of larger pedestals. It had the additional effect of adding a layer of plastic and airspace, with venting, to the upper portion of the pedestal. In the early days of cable taps and amplifiers this helped with heat load but as power levels increased and electronic components became more sensitive to temperature increases, a layer of fiberglass insulation was added to reduce heat transfer from the attic to the inside of the housing. Over the last several years the industry reached a point where those measures were no longer effective by themselves. The next phase involved much greater venting in the sides of the pedestal as well as large vent holes in the top of the pedestal but underneath the attic for weather protection. Additionally, the holes under the attic were designed to allow for direct attachment of cooling fans in extreme conditions. However, the use of fans introduced its own set of problems as they had to be powered, which increased the power transmission requirements to the pedestal, and they introduced electronic noise into the system. They were also prone to failure, which necessitated replacement and additional maintenance costs. These changes reduced the heat buildup inside the housing but were still inadequate and the use of fans was not an acceptable long-term solution.

Previously, pedestal housings have been produced with owner or industry information molded onto an upper surface of the pedestal. Molding information limits the ability to redirect product to different users or build a generic inventory to be labeled prior to delivery. Consequently, because pedestal housings are utilized across many industries and customers, manufacturers produced the pedestal housings without customer or industry specific identification. Once the pedestal housing was sold to the end customer and placed into service an identification placard was positioned thereon. Typically, the identification placard is a tag having a post which was then positioned within a hole located through the upper surface of the pedestal and a fastener was positioned on the post from the bottom surface of the upper surface to retain the tag on the pedestal housing.

A problem with this type of placard is it prevented venting out of the top surface of the pedestal. Therefore, a need exists for an improved pedestal housing design which incorporates an identification placard having the ability to vent out of the top surface of the pedestal housing.

SUMMARY OF THE INVENTION

The present invention is a pedestal housing for active electronic components which generate heat having an identification placard system designed to provide airway venting out of the top surface of the pedestal housing. The housing upper surface includes spaced ridges in which an identification placard is positioned. The housing upper surface has a hole extending therethrough for receipt of a post of the identification placard. The hole includes lobed sections spaced around the post for air passage out of the pedestal. A circumferential raised ring is positioned on the upper surface around the hole having air grooves extending to the lobed sections for passage of air exiting through the lobed sections. The exiting air then passes through openings between the spaced ridges to atmosphere. The present invention includes a fastening system for the identification placard to the pedestal housing comprising a threaded nut for engaging a threaded post, or a retaining ring or a tube and screw for an unthreaded post.

An advantage of the present invention is that it allows manufacturers, distributors, or customers to stock a common vented pedestal and then be able to add customer or specific industry identification placards. These and other aspects of the present invention will be more clearly understood by reference to the following detailed description and drawings.

DETAILED DESCRIPTION

Figure 1:
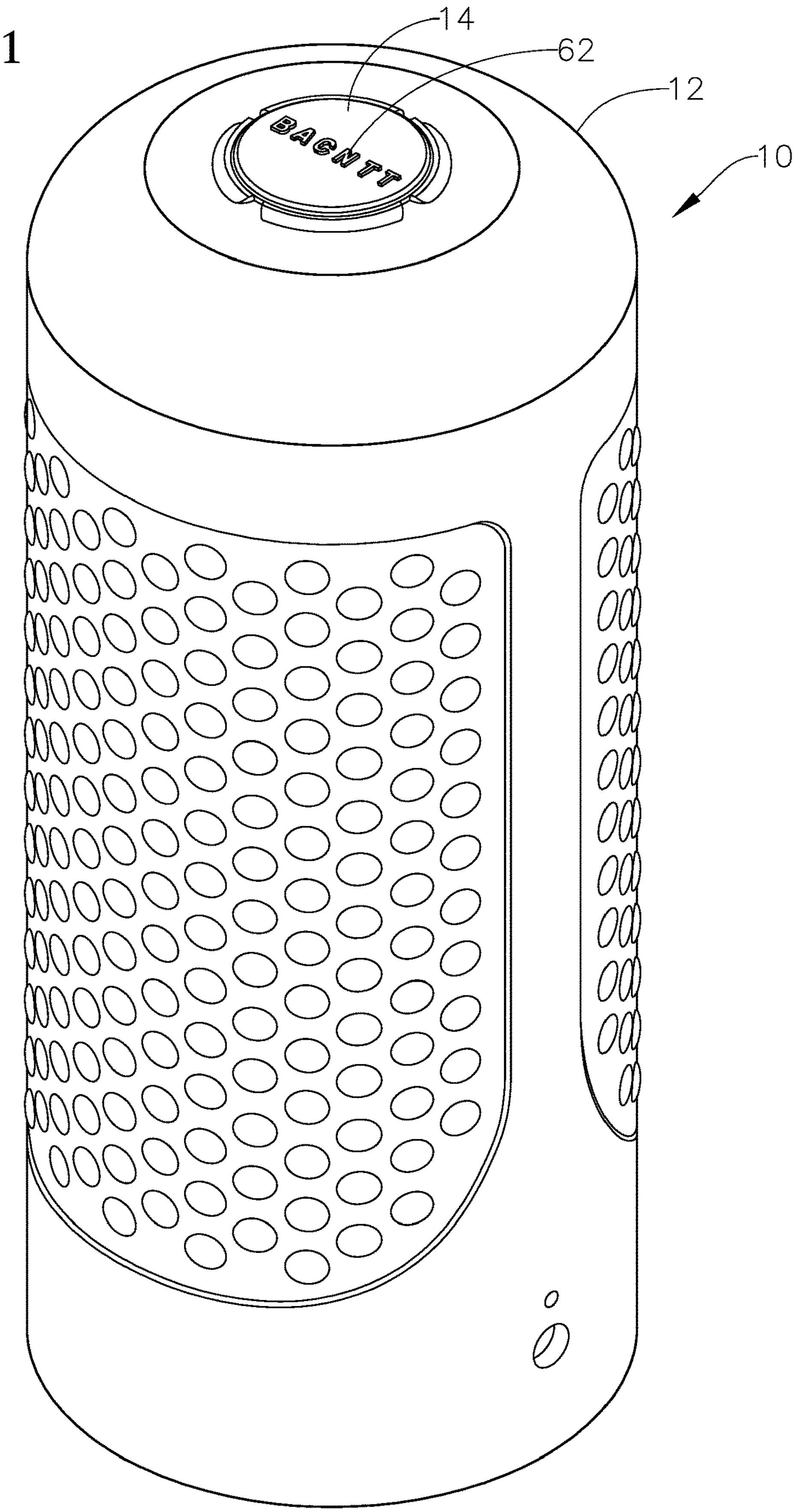
FIG. 1 is a perspective view of a vented pedestal housing of the present invention.
Figure 2:
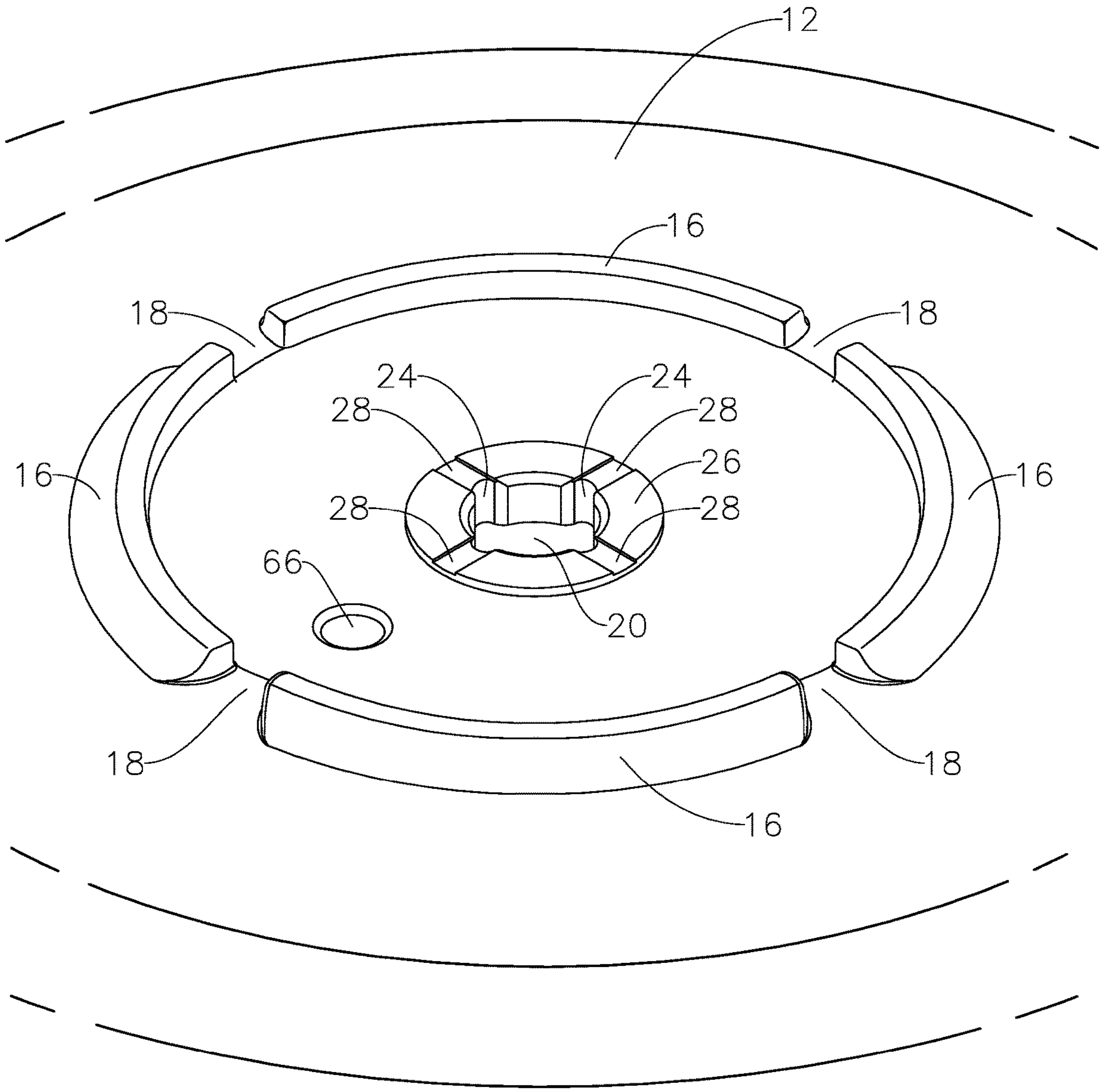
FIG. 2 is a detail view of the upper surface of the pedestal housing of FIG. 1 without the identification placard.
Figure 3:
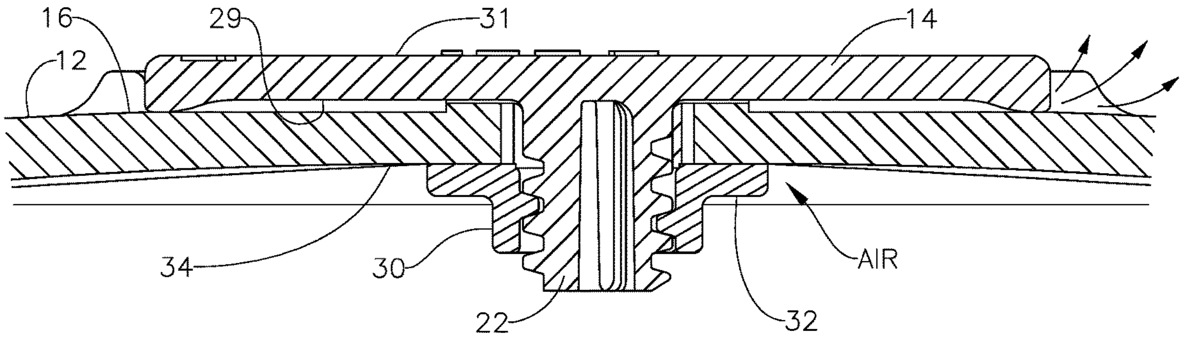
FIG. 3 is a cross-sectional detail view of the pedestal of FIG. 1 illustrating the air flow path out of the pedestal housing.

FIG. 1 illustrates a vented pedestal housing 10 of the present invention. The housing is substantially cylindrical having a curved upper surface 12 and an identification placard 14 is positioned in the center of the upper surface. Although the housing is shown as cylindrical with a curved upper surface, other geometrical shapes are contemplated by the invention. As also shown in FIG. 2, the housing upper surface includes spaced ridges 16 in which an identification placard is positioned. Airflow gaps 18 are located between adjacent ridges 16. The housing upper surface has a hole 20 extending therethrough for receipt of a post 22 of the identification placard as shown in FIG. 3. The hole 20 includes a plurality of lobed sections 24 extending radially outwardly and spaced around the post for air passage out of the pedestal. A circumferential raised ring 26 is positioned on the upper surface extending radially outwardly around the hole 20 having a plurality of air grooves 28 extending radially outward from the lobed sections for passage of air exiting through the lobed sections. The exiting air then passes between a lower surface 29 of a disk portion 31 of the placard and the upper surface of the housing before exiting to atmosphere through the airflow gaps between the spaced ridges.

The present invention includes a fastening system for the identification placard to the pedestal housing comprising a threaded nut 30 for engaging a threaded post 22. Nut 30 has a lip 32 wherein air from within the pedestal housing can escape between the lip and an inside surface 34 of the upper surface and into the lobed sections of hole 20.

Figure 4:
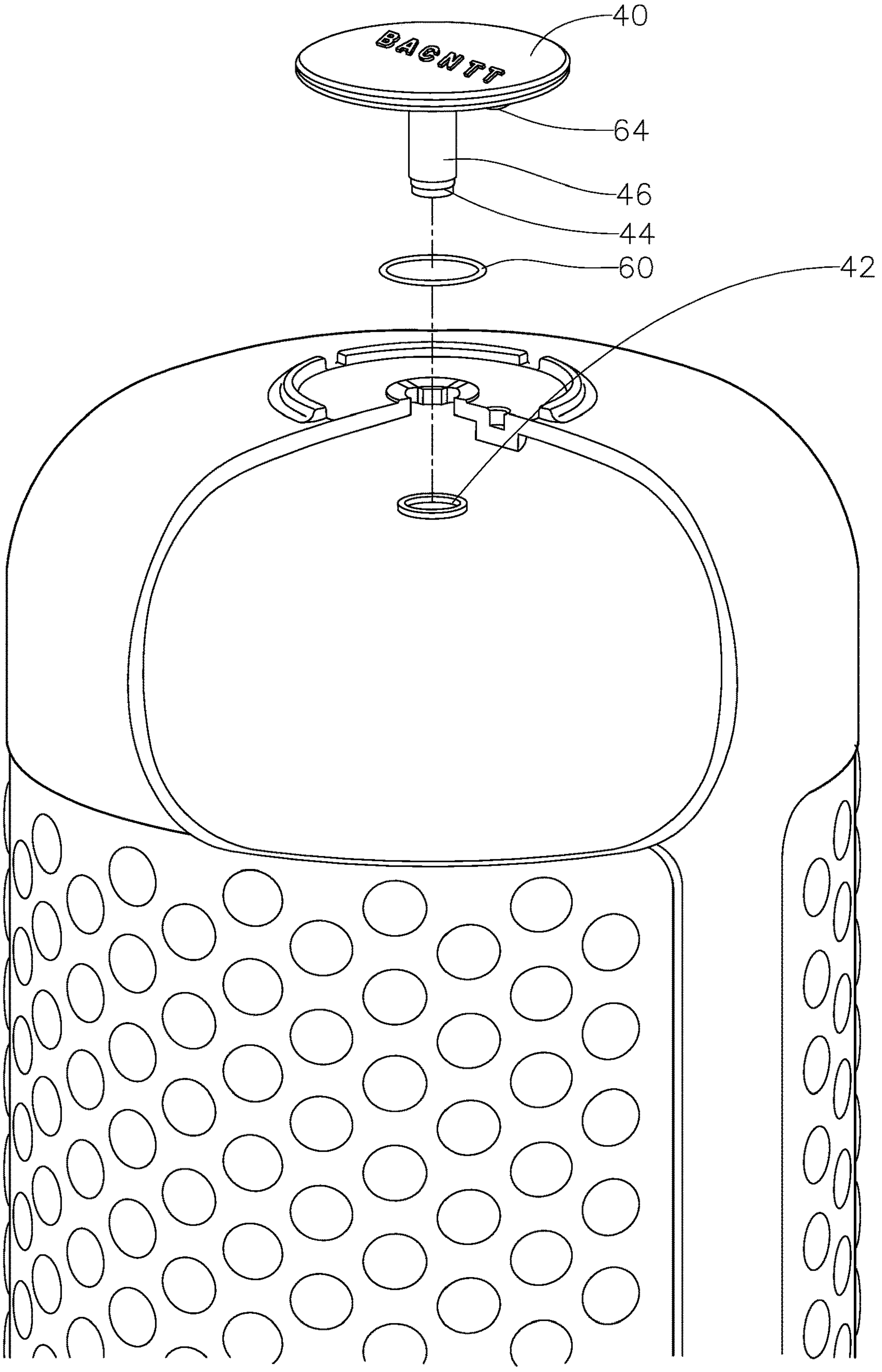
FIG. 4 is an exploded perspective view of an alternative embodiment for attaching the identification placard to the pedestal housing.
Figure 5:
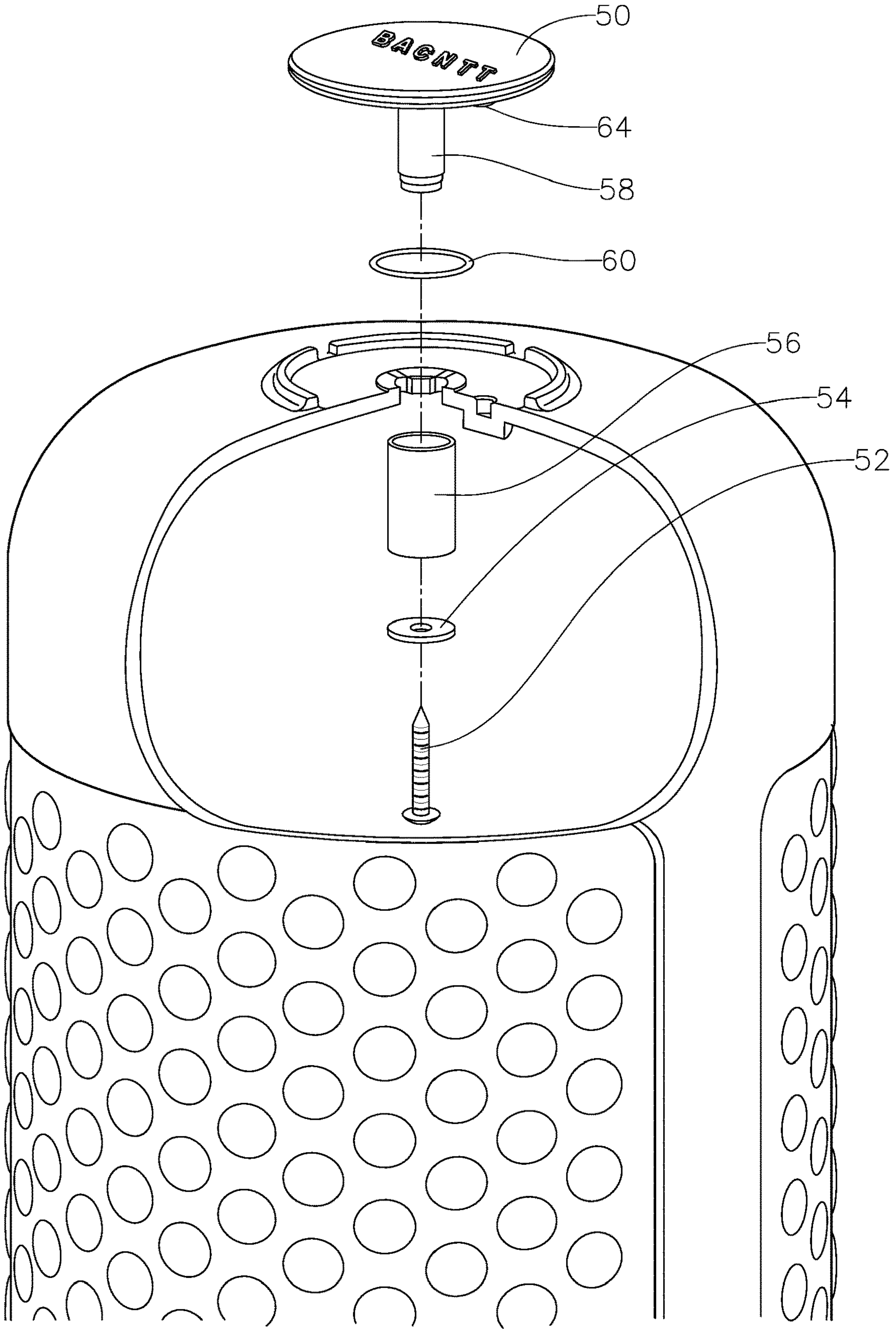
FIG. 5 is an exploded perspective view of another alternative embodiment for attaching the identification placard to the pedestal housing.

FIG. 4 illustrates and alternative embodiment attachment system for an identification placard 40 wherein a retaining ring 42 snaps into a ridge 44 on post 46. FIG. 5 illustrates another alternative embodiment attachment system for and identification placard 50 wherein a screw 52 extends through a washer 54 located at an end of a tube 56 and into and engaging post 58 positioned with tube 56. For applications where airflow out of the housing is not desired an O-ring 60 can be positioned between the placard and the upper surface of the housing.

The identification placard 14, 40, 50 has identifying indicia 62 on its surface, such as owner or other industry specific information. An indexing feature 64 extends from a lower surface of the placard for receipt within a bore 66 on the upper surface of the housing. The indexing feature and the bore align to one another to properly index the placard when installed into the housing.

The pedestal housing typically is made from thermoplastic materials injection molding, blow molding, rotational molding, vacuum molding, and other non-commercially available methods. The present invention is designed for airflow management.

Although the present invention has been described and illustrated with respect to a vented pedestal housing, it is to be understood that other applications of the inventive concepts are also possible such as with fiber closures, grade level boxes and vaults where airflow management is necessary. Although the present invention has been disclosed and illustrated with respect to various embodiments thereof, it is to be understood that changes and modifications can be made therein which are within the full intended scope of the invention as hereinafter claimed.

What is claimed is:

1. A vented communications pedestal comprising:

a pedestal housing having an upper surface; and an identification placard assembly positioned on and extending through the upper surface of the pedestal housing;

wherein the upper surface includes air flow passages allowing air flow through the upper surface between the pedestal housing and the identification placard assembly, and wherein the air flow passages include a hole through the upper surface, the hole having lobed portions extending radially outwardly around a perimeter of the hole.

2. The pedestal of claim 1, wherein the upper surface of the pedestal housing includes a raised ring extending radially outwardly around the perimeter of the hole.

3. The pedestal of claim 2, wherein the raised ring has air grooves extending radially outwardly from the lobed portions.

4. The pedestal of claim 1, wherein the identification placard assembly has an upper disk portion and a post extending from the upper disk portion, the post extending through the hole and having a fastener engaging the post for attaching the identification placard assembly to the upper surface of the housing.

5. The pedestal of claim 4, wherein the post is threaded and the fastener is a threaded nut.

6. The pedestal of claim of claim 4, wherein the post includes a ridge and the fastener is a retaining ring for receipt within the ridge.

7. The pedestal of claim 4, wherein the post has a hollow interior and the fastener is a tube extending around the post, a washer positioned on an end of the tube and a screw extending through the washer and engaging the hollow interior of the post.

8. The pedestal of claim 1, wherein the upper surface has a plurality of spaced raised ridges forming air flow gaps on the upper surface around the identification placard assembly.

9. A vented communications pedestal housing comprising:

an upper surface portion; and a hole extending through the upper surface portion configured for receipt of an identification placard assembly which extends through the hole and rests on the upper surface portion of the pedestal housing;

wherein the hole includes air flow passages allowing air flow through the upper surface portion between the pedestal housing and the identification placard assembly.

10. The housing of claim 9, wherein the air flow passages through the upper surface portion include the hole having lobed portions extending radially outwardly around a perimeter of the bore hole.

11. The housing of claim 10, wherein the upper surface portion of the pedestal housing includes a raised ring extending radially upwardly above the upper surface portion and outwardly around the perimeter of the hole.

12. The housing of claim 11, wherein the raised ring has air grooves extending radially outward from the lobed portions.

13. The housing of claim 10, wherein the identification placard assembly has an upper disk portion and a post extending from the upper disk portion, the post extending through the hole and having a fastener engaging the post for attaching the identification placard assembly to the upper surface portion of the housing.

14. The housing of claim 13, wherein the post is threaded and the fastener is a threaded nut.

15. The housing of claim 13, wherein the post includes a ridge and the fastener is a retaining ring for receipt within the ridge.

16. The housing of claim 13, wherein the post has a hollow interior and the fastener is a tube extending around the post, a washer positioned on an end of the tube and a screw extending through the washer and engaging the hollow interior of the post.

17. The housing of claim 9, wherein the upper surface portion has a plurality of spaced raised ridges extending upwardly from the upper surface portion forming air flow gaps on the upper surface portion around the identification placard assembly positioned within the spaced raised ridges.

18. The housing of claim 9, further comprising an O-ring positioned between the identification placard assembly and the upper surface portion.

19. A vented communications pedestal housing comprising:

a pedestal housing having an upper surface;

the upper surface having a hole through the upper surface, the hole having lobed portions extending radially outwardly around a perimeter of the hole, a raised ring extending upwardly above the upper surface and radially outwardly around the perimeter of the hole, and air grooves on the raised ring extending radially outwardly from the lobed portions; and an identification placard assembly positioned on and extending through the upper surface of the pedestal housing;

wherein the identification placard assembly has an upper disk portion and a post extending from the upper disk portion, the post extending through the hole and having a fastener engaging the post for attaching the identification placard assembly to the upper surface of the housing; and wherein the upper surface has a plurality of spaced raised ridges extending upwardly above the upper surface forming air flow gaps on the upper surface around the identification placard assembly positioned within the spaced raised ridges.

* * * * *